(12) United States Patent
Lin et al.

(10) Patent No.: US 10,249,357 B1
(45) Date of Patent: Apr. 2, 2019

(54) SEMICONDUCTOR DEVICE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wen-Chin Lin, Tainan (TW); Jhih-Yuan Chen, Kaohsiung (TW); Syue-Ren Wu, Hsinchu (TW); Meng-Hsun Wu, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 4 days.

(21) Appl. No.: 15/821,762

(22) Filed: Nov. 23, 2017

(30) Foreign Application Priority Data

Nov. 2, 2017 (CN) .......................... 2017 1 1063266

(51) Int. Cl.
*G11C 11/24* (2006.01)
*G11C 11/403* (2006.01)
*H01L 27/108* (2006.01)

(52) U.S. Cl.
CPC ...... *G11C 11/403* (2013.01); *H01L 27/10844* (2013.01)

(58) Field of Classification Search
CPC .................... G11C 11/408; H01L 27/10844
See application file for complete search history.

(56) References Cited

U.S. PATENT DOCUMENTS

| | | | |
|---|---|---|---|
| 6,265,778 B1 * | 7/2001 | Tottori | H01L 23/5258 257/529 |
| 6,417,051 B1 * | 7/2002 | Takebuchi | H01L 27/105 438/287 |
| 6,468,838 B2 * | 10/2002 | Chien | H01L 21/823814 257/E21.634 |
| 8,440,526 B2 * | 5/2013 | Liao | H01L 27/11573 257/E21.302 |
| 2005/0014330 A1 | 1/2005 | Park | |

\* cited by examiner

*Primary Examiner* — Pho M Luu
(74) *Attorney, Agent, or Firm* — Winston Hsu (57) ABSTRACT

A semiconductor device includes a substrate having a memory region and a peripheral region defined thereon, wherein the peripheral region comprises at least one transistor, the memory region comprises a plurality of memory cells, each memory cell comprises at least one gate structure and a capacitor structure, a mask layer disposed on the capacitor structure in the memory region, and a dielectric layer disposed on the substrate within the peripheral region, wherein a top surface of the dielectric layer is aligned with a top surface of the mask layer.

19 Claims, 7 Drawing Sheets

SEMICONDUCTOR DEVICE AND MANUFACTURING METHOD THEREOF

BACKGROUND OF THE INVENTION

1. Field of the Invention

The present invention relates to a semiconductor device, and more particularly, to a method for solving the dishing problem that the dielectric layer in the peripheral region of the semiconductor device has a concave top surface during the planarization process, and improves the yield of the semiconductor device.

2. Description of the Prior Art

Dynamic random access memory (DRAM) is a major volatile memory and is an important element in many electronic products. DRAM consists of a large number of memory cells aggregated to form an array region for storing data. Each memory cell is composed of a metal oxide semiconductor (MOS) transistor connecting a capacitor.

The capacitor is located in a memory region, while a peripheral region is disposed adjacent to the memory region. The peripheral region includes other transistors and contact structures. In general, the capacitor located in the memory region has a higher height, thereby having better charge-storage efficiency. However, since the unbalance force or the difference of the capacitance height, the quality of the elements formed in the boundary between the memory region and the peripheral region may be influenced.

SUMMARY OF THE INVENTION

The present invention provides a semiconductor device, the semiconductor device includes a substrate having a memory region and a peripheral region defined thereon, wherein the peripheral region comprises at least one transistor, the memory region comprises a plurality of memory cells, each memory cell comprises at least one gate structure and a capacitor structure, a mask layer disposed on the capacitor structure in the memory region, and a dielectric layer disposed on the substrate within the peripheral region, wherein a top surface of the dielectric layer is aligned with a top surface of the mask layer.

The present invention provides a method for fabricating a semiconductor device, the method includes: first, a substrate is provided, a memory region and a peripheral region are defined thereon, the peripheral region comprises at least one transistor, the memory region comprises a plurality of memory cells, each memory cell comprises at least one gate structure and a capacitor structure, a mask layer is formed on the capacitor structure within the memory region and on the transistor within the peripheral region, afterwards, a first dielectric layer is formed on the mask layer, next, a first planarization process is performed to remove parts of the first dielectric layer, and to form a concave surface on the top of the first dielectric layer within the peripheral region, a second dielectric layer is then covered within the memory region and with the peripheral region, and a second planarization process is performed, to remove parts of the second dielectric layer.

The present invention is characterized in that since the thickness of the dielectric layer in the peripheral region is large and the device density in the peripheral region is relative small, it is easy occurring a dishing top surface on the top of the dielectric layer during the planarization process. Therefore, the invention forms additional dielectric layer, preferably the material of the additional dielectric layer is same as the material of the original dielectric layer, to fill the above-mentioned dishing top surface, so as to improve the yield of subsequent other components, such as the contact structures.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
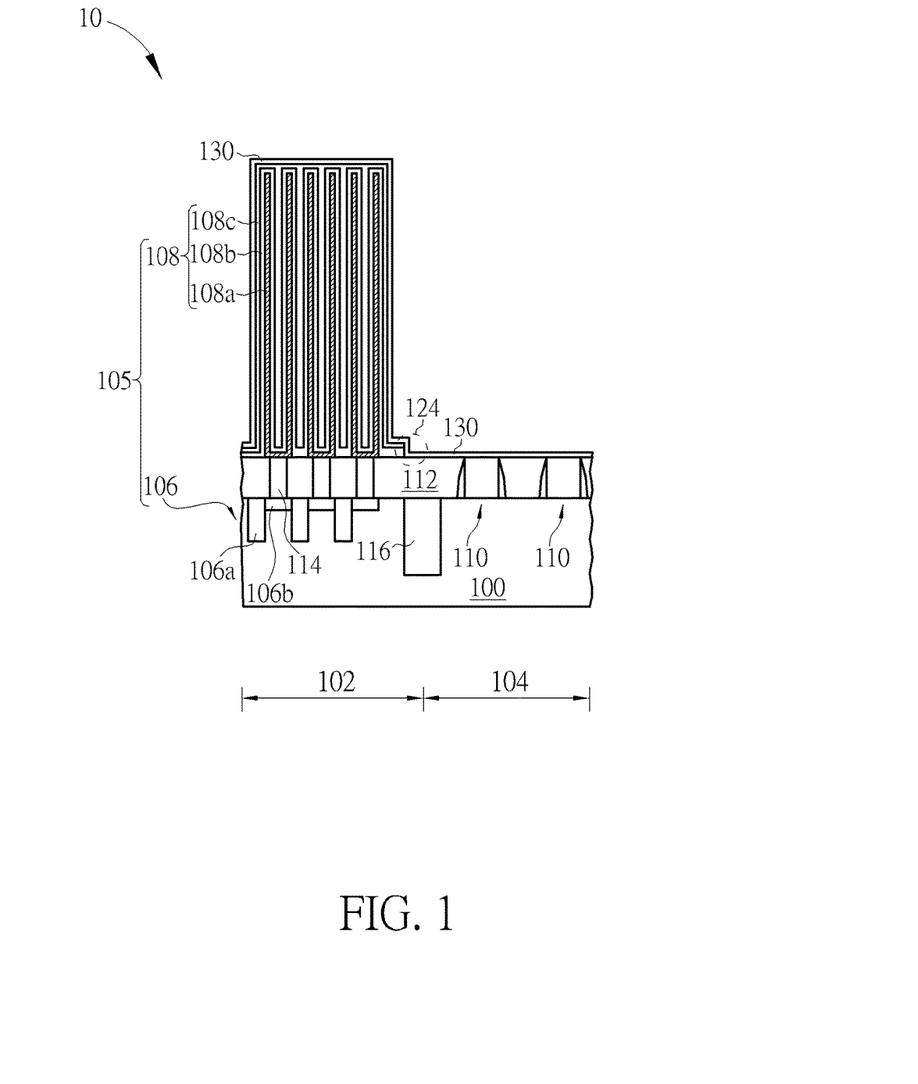
FIG. 1, FIG. 2, FIG. 3, FIG. 4, FIG. 5 and FIG. 6 are schematic diagrams of a dynamic random access memory (DRAM) at a boundary between a memory region and a peripheral region according to a first preferred embodiment of the present invention.

Please refer to FIG. 1 to FIG. 6, which illustrate schematic diagrams of a dynamic random access memory (DRAM) at a boundary between a memory region and a peripheral region according to a first preferred embodiment of the present invention. As shown in FIG. 1, a dynamic random access memory (DRAM) 10 is provided. The dynamic random access memory 10 includes a substrate 100, at least a memory region 102 and a peripheral region 104 are defined on the substrate 100. A plurality of first transistors 106 and a plurality of capacitors 108 are formed in the memory region 102. The peripheral region 104 also includes a plurality of second transistors 110. The first transistor 106 within the memory region 102 includes, for example, a buried word line 106a and the source/drain 106b in the substrate 100. The capacitor 108 includes a lower electrode 108a, an insulating layer 108b and an upper electrode 108c. Besides, in some embodiments, a mask structure (not shown) maybe further formed on the upper electrode 108c. However, the mask structure usually covers only the top surface and sidewalls of the capacitor 108 and does not cover in the peripheral region 104. Each first transistor 106 and each capacitor 108 constitute a memory cell 105. Between the capacitor 108 and the transistor 106, a single layer or multiple-layers structure of a dielectric layer 112 and a contact structure 114 may be included. The contact structures 114 connect the source/drain 106b of the first transistor 106 and the capacitor 108.

In this embodiment, a mask layer 130 is fully formed in the memory region 102 and the peripheral region 104, covering at least the upper electrode 108c of the capacitor 108, and a bottom corner 124 disposed at the bottom portion between the memory region 102 and the peripheral region 104. The mask layer 130 is preferably formed by atomic layer deposition (ALD) process, and the material includes such as silicon nitride, but is not limited thereto. The function of the mask layer 130 is to act as a stop layer for the subsequent planarization process, which will be described in subsequent steps.

In addition, at least one shallow trench isolation 116 is further included in the substrate of the memory region 102 and the peripheral region 104. In addition, the DRAM 10 herein may further include other common elements, such as bit lines, contact etch stop layers and the like. To simplify the diagram, these elements are not shown in figures.

Figure 2:
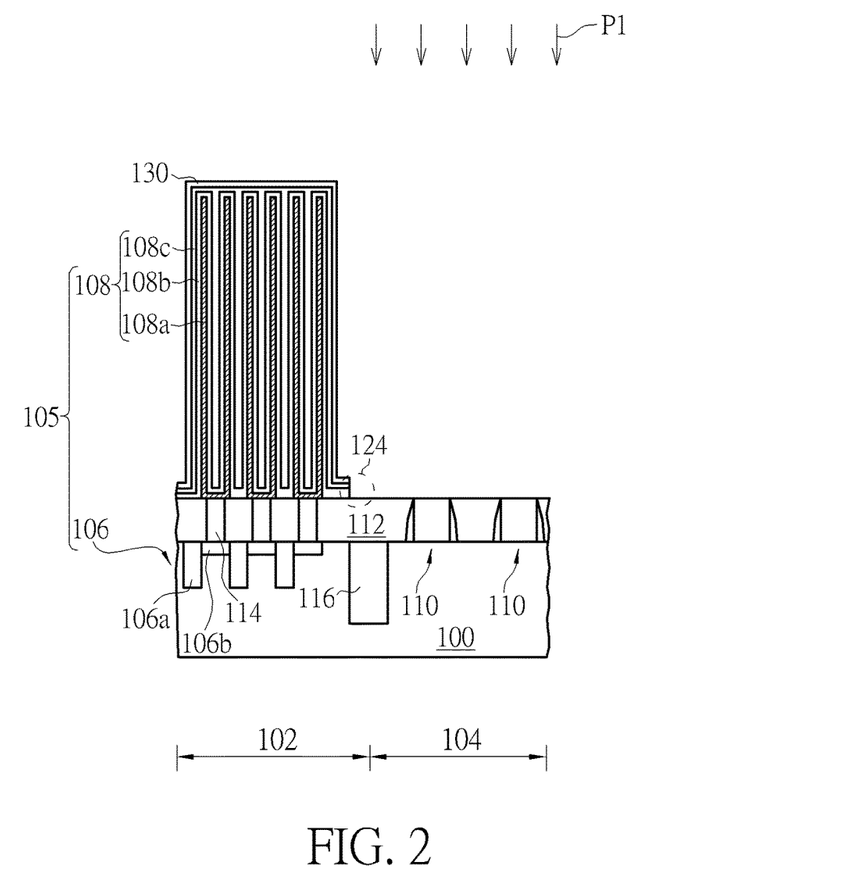

As shown in FIG. 2, an etching process P1 is performed to remove the mask layer 130 in the peripheral region 104, and to expose the second transistor 110 in the peripheral region 104. It is worth noting that in other embodiments of the present invention, the mask layer 130 within the peripheral region 104 may not be removed and can be remained within the peripheral region 104. In the subsequent steps, within the peripheral region 104, contact structure can be formed and penetrating through the mask layer 130, and electrically connected to the second transistor 110. It is also within the scope of the present invention. In other words, the steps shown in FIG. 2 may be omitted.

Figure 3:
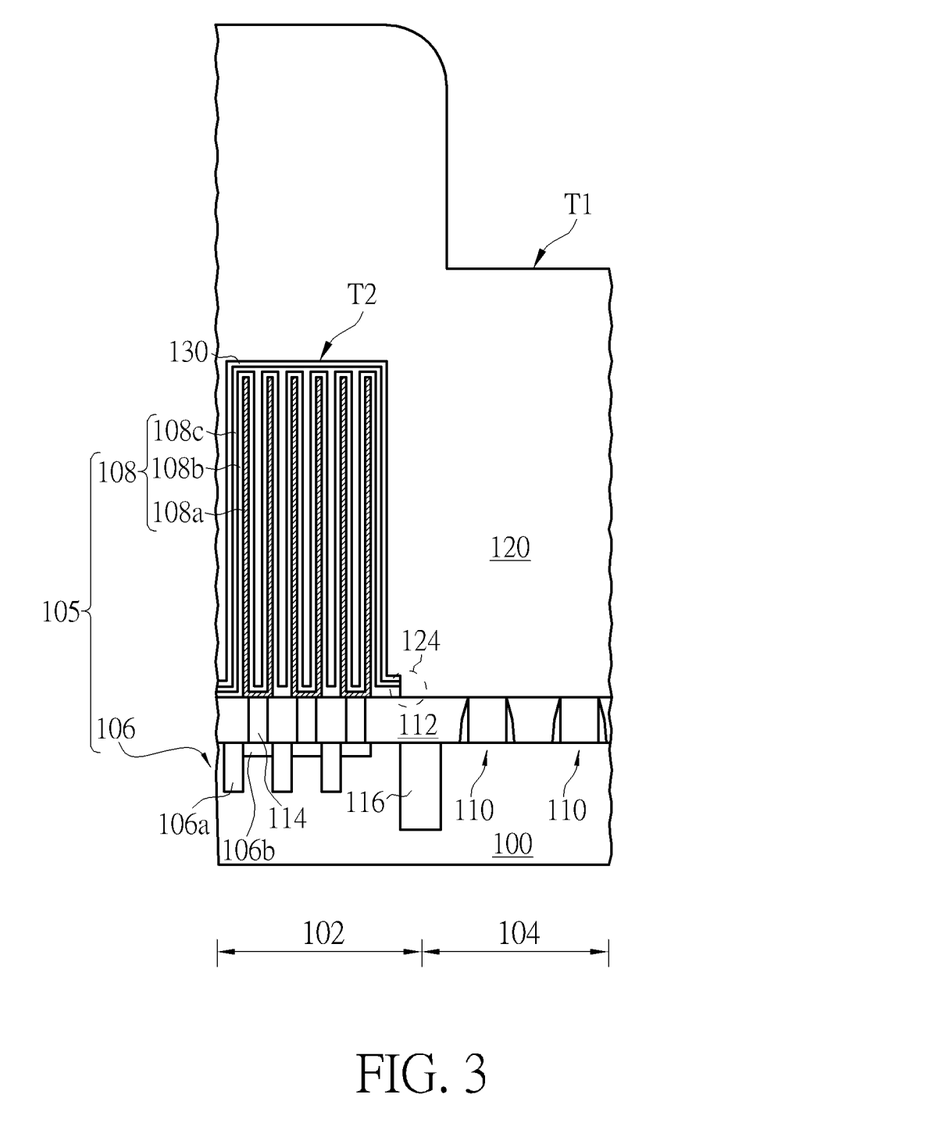

Referring to FIG. 3, after the mask layer 130 has been formed, a dielectric layer 120 is entirely formed on the substrate 100. The material of the dielectric layer 120 includes, for example, silicon oxide or tetraethyl orthosilicate (TEOS), the dielectric layer 120 covers the capacitor 108 and the mask layer 130, and the second transistor 110 in the peripheral region 104 (in some embodiments, if the step described in FIG. 2 is omitted, the dielectric layer 120 covers the mask layer 130 in the peripheral region 104). It is noteworthy that the dielectric layer 120 usually has a great thickness (typically exceeding 1.5 micrometers), in order to make the dielectric layer 120 completely cover the capacitor 108, the thickness of the dielectric layer 120 should be larger than the thickness of the capacitor 108. For example, the dielectric layer 120 in this embodiment has a thickness of about 1.9 micrometers, but is not limited thereto. Therefore, a top surface T1 of the dielectric layer 120 located in the peripheral region 104 is higher than a top surface T2 of the mask layer 130 in the memory region 102.

Figure 4:
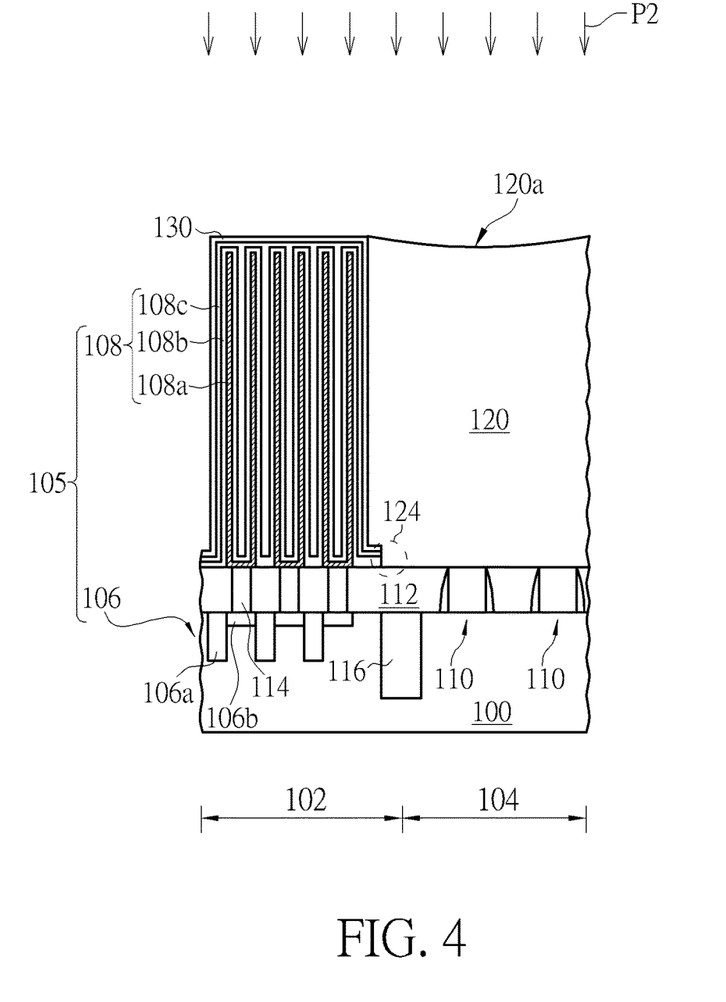

As shown in FIG. 4, the mask layer 130 in the memory region 102 is used as a stop layer, a planarization process P2 is performed to remove the dielectric layer 120 in the memory region 102 and in the peripheral region 104 until the top surface of mask layer 130 within the memory region 102 is exposed. It should be noted that after the planarization process P2 such as chemical mechanical polishing (CMP) is performed, since the region of the peripheral region 104 is relatively large, and the mask layer 130 acted as a stop layer is not disposed within the peripheral region 104, it is possible that the dielectric layer 120 in the peripheral region 104 may occur a dishing phenomenon. In other words, when the planarization process P2 has stopped at the top surface of the mask layer 130 within the memory region 102, the dielectric layer 120 in the peripheral region 104 will still be partially etched, resulting in the dielectric layer 120 in the peripheral region 104 has a concave top surface 120a.

Figure 4A:
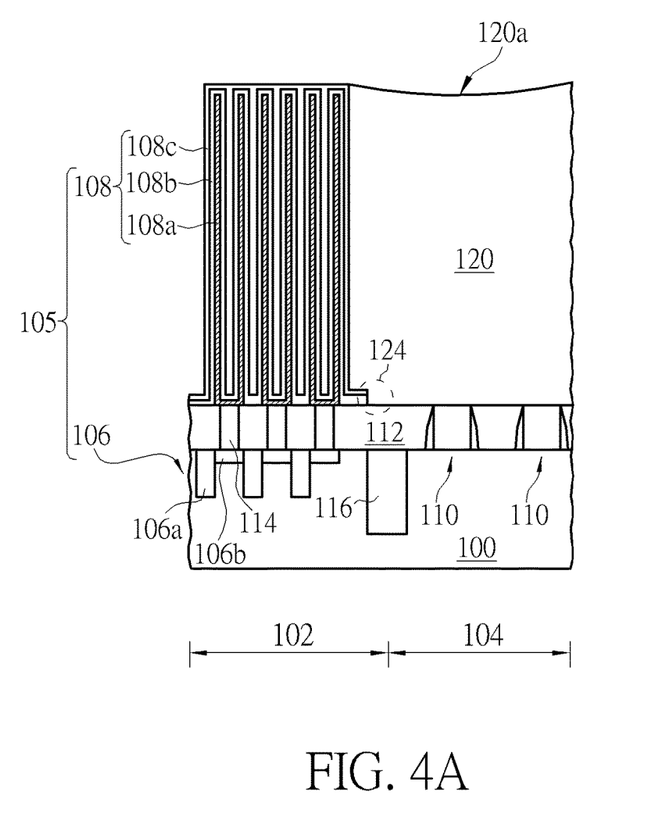
FIG. 4A illustrates a schematic diagram of a DRAM at a boundary between a memory region and a peripheral region according to another preferred embodiment of the present invention.

In other embodiments of the present invention, as shown in FIG. 4A, a schematic diagram of a semiconductor device continued from the step of FIG. 4 according to another preferred embodiment of the present invention is shown. Before proceeding with the subsequent steps, an additional etching process may be performed to remove the mask layer 130 in the memory region 102. Therefore, in this embodiment, the upper electrode 108c of the capacitor 108 is exposed. This embodiment is also within the scope of the present invention. However, this step is not a necessary step of the present invention, in other words, this step can be omitted. The structure shown in FIG. 4 will be continued described in subsequent paragraphs.

Figure 5:
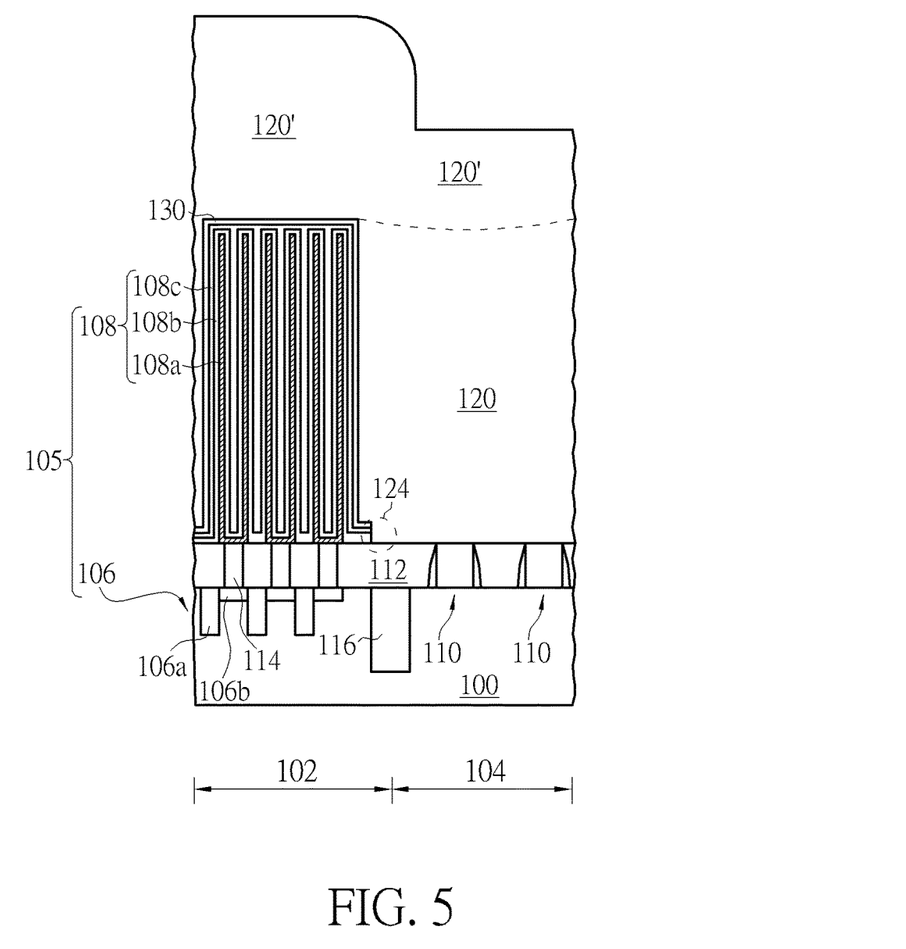

The dielectric layer 120 in the peripheral region 104 includes a concave top surface 120a, which will affect the yield of subsequent semiconductor devices. For example, the contact structure and other elements in the dielectric layer 120 subsequently formed in the peripheral region 104 may be affected. In order to solve the above problem, in the first embodiment of the present invention, as shown in FIG. 5, after performing the planarization process P2, a dielectric layer 120' is formed again to cover the original dielectric layer 120 and the top of the mask layer 130 within the memory region 102. Preferably, the material of the dielectric layer 120' is the same as that of the dielectric layer 120, such as silicon oxide or tetraethyl orthosilicate (TEOS). The thickness of the dielectric layer 120' is preferably smaller than half of the thickness of the dielectric layer 120, in the present embodiment, the dielectric layer 120' has a thickness of less than 9500 angstroms, but is not limited thereto.

Figure 6:
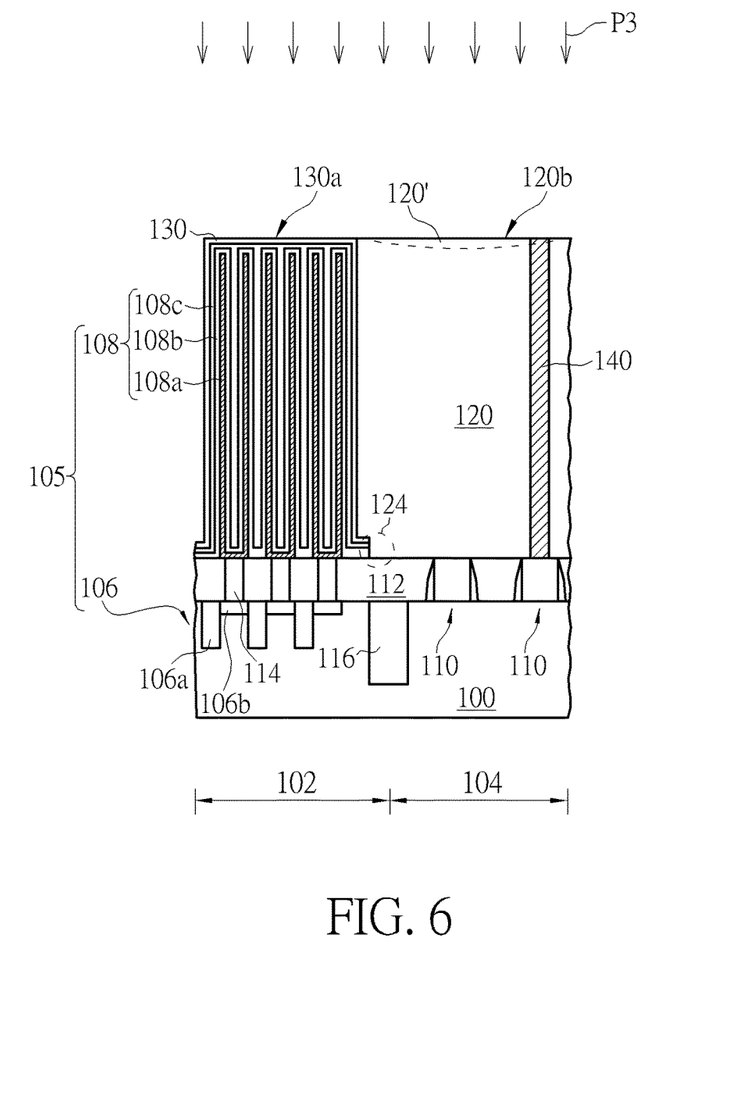

As shown in FIG. 6, a planarization process P3 is performed, to remove the extra dielectric layer 120' until the top surface of the mask layer 130 is exposed (or in other embodiments, if the mask layer 130 has been removed, the top surface of the upper electrode 108c is exposed). At this time, the top surface 130a of the mask layer 130 within the memory region 102 will be aligned with the top surface 120b of the dielectric layer 120'. Subsequently, the contact structures 140 can be formed in the dielectric layer 120' and in the dielectric layer 120. The contact structure 140 includes materials having good electrical conductivity such as tungsten and, the contact structure 140 is electrically connected to the second transistor 110. The top surface of the contact structure 140 is aligned with the top surface 120b of the dielectric layer 120', and the top surface of the contact structure 140 is also aligned with the top surface 130a of the mask layer 130. This method is well known to those skilled in the art and will not be repeated here.

The present invention is characterized in that since the thickness of the dielectric layer in the peripheral region is large and the device density in the peripheral region is relative small, it is easy to occur a dishing top surface on the top of the dielectric layer during the planarization process. Therefore, the invention forms additional dielectric layer, preferably the material of the additional dielectric layer is same as the material of the original dielectric layer, to fill the above-mentioned dishing top surface, so as to improve the yield of subsequent other components, such as the contact structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a memory region and a peripheral region defined thereon, wherein the peripheral region comprises at least one transistor, the memory region comprises a plurality of memory cells, and each memory cell comprises at least one gate structure and a capacitor structure;
   a mask layer disposed on the capacitor structure in the memory region; and
   a dielectric layer disposed on the substrate within the peripheral region, wherein a top surface of the dielectric layer is aligned with a top surface of the mask layer.

2. The semiconductor device of claim 1, wherein the material of the dielectric layer comprises silicon oxide.

3. The semiconductor device of claim 1, wherein the material of the mask layer comprises silicon nitride.

4. The semiconductor device of claim 1, wherein a boundary between the memory region and the peripheral region comprises a bottom corner, and the mask layer covers at least the bottom corner.

5. The semiconductor device of claim 1, further comprising at least one contact structure located in the dielectric layer and electrically connected to the transistor, wherein a top surface of the contact structure is aligned with a top surface of the mask layer.

6. The semiconductor device of claim 1, wherein the mask layer is not located on the substrate within the peripheral region.

7. The semiconductor device of claim 1, wherein a portion of the mask layer is located on the substrate within the peripheral region.

8. A method for fabricating a semiconductor device, comprising:
   providing a substrate, a memory region and a peripheral region are defined thereon, wherein the peripheral region comprises at least one transistor, the memory region comprises a plurality of memory cells, each memory cell comprises at least one gate structure and a capacitor structure;
   forming a mask layer on the capacitor structure within the memory region and on the transistor within the peripheral region;
   forming a first dielectric layer on the mask layer;
   performing a first planarization process to remove parts of the first dielectric layer, and to form a concave surface on the top of the first dielectric layer within the peripheral region;
   covering a second dielectric layer within the memory region and with the peripheral region; and
   performing a second planarization process, to remove parts of the second dielectric layer.

9. The method of claim 8, wherein the first dielectric layer and the second dielectric layer comprise the same material.

10. The method of claim 8, wherein a thickness of the first dielectric layer is more than twice than a thickness of the second dielectric layer.

11. The method of claim 10, wherein a thickness of first dielectric layer is more than 15000 angstroms.

12. The method of claim 8, wherein an etching process is performed to remove parts of the mask layer within the peripheral region before the first dielectric layer is formed.

13. The method of claim 8, wherein an etching process is performed to remove the mask layer within the memory region after the first planarization process is performed.

14. The method of claim 8, wherein the mask layer is still located at the top of the capacitor structure after the second planarization process is performed, and a top surface of the second dielectric layer is aligned with a top surface of the mask layer.

15. The method of claim 8, further comprising forming at least one contact structure in the first dielectric layer and electrically connected to the transistor, wherein a top surface of the contact structure is aligned with a top surface of the mask layer.

16. The method of claim 8, wherein the second dielectric layer has a flat top surface after the second planarization process is performed.

17. The method of claim 8, wherein the material of the first dielectric layer and the material of the second dielectric layer comprise silicon oxide.

18. The method of claim 8, wherein the material of the mask layer comprises silicon nitride.

19. The method of claim 8, wherein a top surface of the first dielectric layer within the peripheral region is higher than a top surface of the capacitor structure within the memory region after the first dielectric layer is performed.

* * * * *